US011264070B2

(12) United States Patent
Nien et al.

(10) Patent No.: US 11,264,070 B2
(45) Date of Patent: Mar. 1, 2022

(54) SYSTEMS AND METHODS FOR MEMORY OPERATION USING LOCAL WORD LINES

(71) Applicant: Taiwan Semiconductor Manufacturing Company Limited, Hsinchu (TW)

(72) Inventors: Yi-Hsin Nien, Hsinchu (TW); Hidehiro Fujiwara, Hsinchu (TW); Yen-Huei Chen, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 47 days.

(21) Appl. No.: 16/744,321

(22) Filed: Jan. 16, 2020

(65) Prior Publication Data

US 2021/0225420 A1 Jul. 22, 2021

(51) Int. Cl.
| | | |
|---|---|---|
| *G11C 11/00* | (2006.01) | |
| *G11C 8/08* | (2006.01) | |
| *G11C 8/14* | (2006.01) | |
| *G11C 16/10* | (2006.01) | |
| *G11C 16/26* | (2006.01) | |
| *G11C 16/08* | (2006.01) | |

(52) U.S. Cl.
CPC ............... *G11C 8/08* (2013.01); *G11C 8/14* (2013.01); *G11C 16/08* (2013.01); *G11C 16/10* (2013.01); *G11C 16/26* (2013.01)

(58) Field of Classification Search
CPC ....... G11C 11/419; G11C 11/418; G11C 7/12; G11C 7/18; G11C 5/063; G11C 8/16; G11C 17/18; G11C 8/14; G11C 11/4096; G11C 11/413; G11C 8/10; G11C 8/18; G11C 11/4085; G11C 16/24; G11C 16/26
See application file for complete search history.

(56) References Cited

U.S. PATENT DOCUMENTS

| | | | |
|---|---|---|---|
| 4,969,125 A | 11/1990 | Ciraula et al. | |
| 9,202,555 B2 | 12/2015 | Jung et al. | |
| 9,646,681 B1 * | 5/2017 | Jung ..................... | G11C 11/412 |
| 2010/0124099 A1 * | 5/2010 | Wu ........................ | G11C 11/412 365/154 |
| 2014/0112061 A1 | 4/2014 | Jung et al. | |

(Continued)

FOREIGN PATENT DOCUMENTS

DE 102014019386 7/2015

OTHER PUBLICATIONS

German Office Action; Application No. 10 2020 101 397.3; dated Sep. 10, 2020.

(Continued)

*Primary Examiner* — Hien N Nguyen
(74) *Attorney, Agent, or Firm* — Jones Day

(57) ABSTRACT

Systems and method are provided for a memory circuit. In embodiments, the circuit includes a plurality of memory cells corresponding to a word of data and a global write word line. A plurality of local write lines are connected to a subset of the plurality of memory cells of the word of data. Selection logic is configured to activate a particular subset of memory cells for writing via a particular local write line based on a signal on the global write line and a selection signal associated with the particular subset of memory cells.

20 Claims, 7 Drawing Sheets

(56) References Cited

U.S. PATENT DOCUMENTS

2014/0219039 A1* 8/2014 Jung .................... G11C 7/12
                                                              365/189.16
2015/0162052 A1* 6/2015 Huang ................. G11C 11/417
                                                              365/51

OTHER PUBLICATIONS

Korean Office Action; Application No. 10-2020-0047543; dated Aug. 27, 2021.
Taiwan Office Action; Application No. 109138655; dated Feb. 24, 2021.

* cited by examiner

SYSTEMS AND METHODS FOR MEMORY OPERATION USING LOCAL WORD LINES

BACKGROUND

A memory circuit (e.g., a random access memory circuit) uses memory cells to store a plurality of bits of data. Memory circuits may be configured to operate on words of data, each word of data containing a particular number of bits (e.g., 16, 32, 64, 128 bits). Particularly, a word of data may be written to the memory circuit, where data present on input pins is stored in the memory cells for later recall. And a word of data may be read from the memory circuit, where data stored in the memory cells is output to output pins for use outside of the memory circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
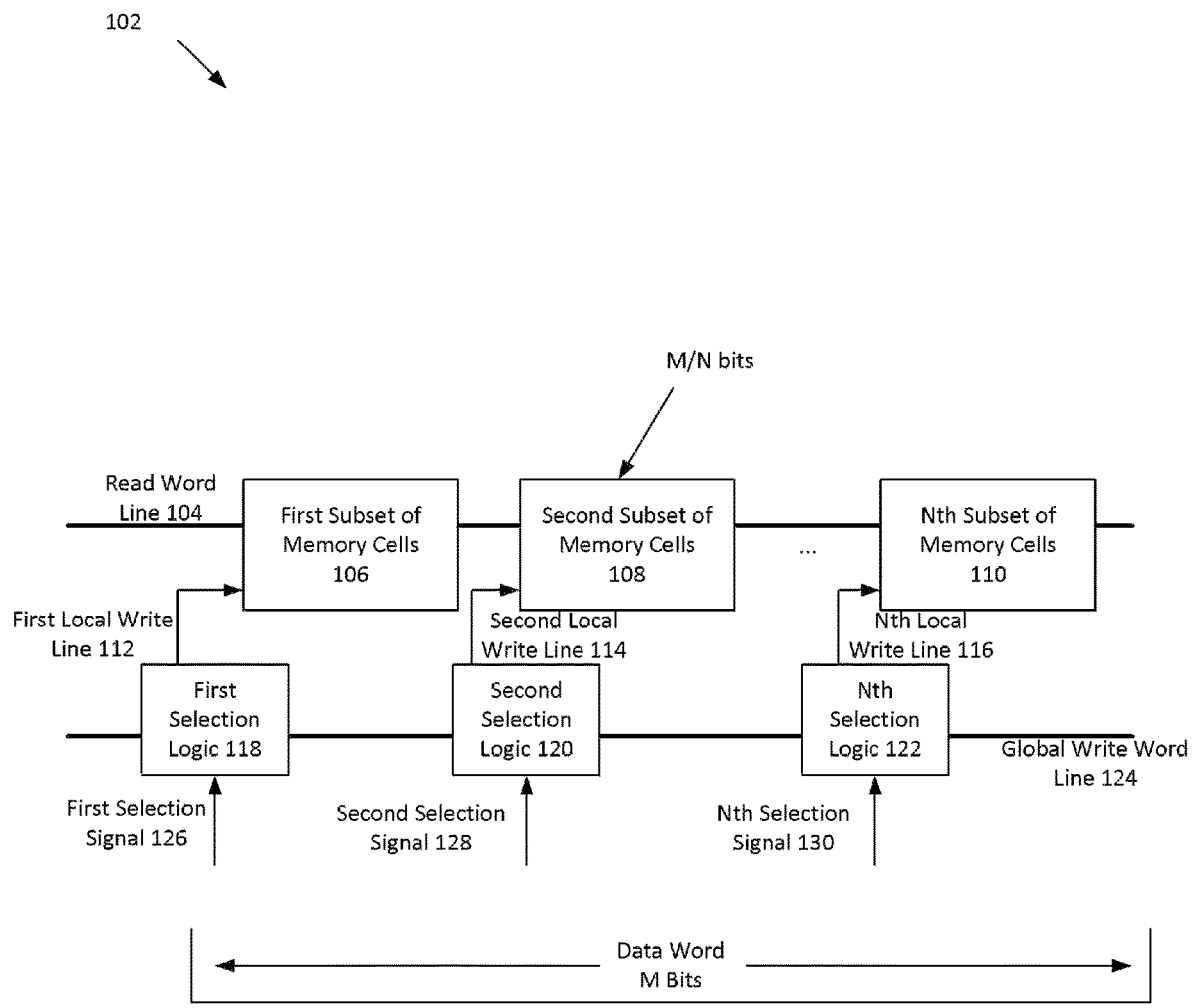
FIG. 1 is a block diagram depicting a memory circuit according to an exemplary embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram depicting a memory circuit (e.g., a random access memory) according to an exemplary embodiment. A memory circuit 102 controls the storage, reading, and writing of one word of data that is M bits long. The memory circuit 102 stores bits of data that make up the data word in memory cells 106, 108, 110, each memory cell storing one or more bit of data. Each memory cell includes one or more pins for receiving data to be written to that memory cell and one or more pins for outputting data read from the memory cell. In some embodiments, writing and read operations may be performed using shared pins that can be used for reading or writing data, depending on the operating mode of the memory circuit.

Memory cells utilize activation signals to control operations of individual memory cells. For example, a memory cell can be configured to store (i.e., write) a bit of data present on its input pin when it receives a write signal. And that memory cell can be configured to output a bit stored in the memory cell when it receives a read signal. In some implementations, a common write or read signal is provided to all memory cells of a data word at the same time, facilitating operations on an entire word of data at a time. For example, when an activation signal is transmitted on a write word line, all of the memory cells of the data word will store the data present on their respective input pin. And when an activation signal is transmitted on a read word line, all of the memory cells of the data word will output their stored data to their respective output pin. FIG. 1 depicts a read word line 104 that provides a common read enable signal to all of the memory cells of the M-bit-wide data word.

In contrast, write enable signals in the example of FIG. 1 are not commonly provided to all of the memory cells of the data word. As shown in FIG. 1, the memory cells of the memory circuit 102 are divided into a plurality of subsets 106, 108, 110. In one example, the memory circuit operates on a data word that is M=32 bits wide that is divided in N=4 subsets, with each subset being associated with M/N=8 bits of data (1 byte). In the example of FIG. 1, each subset of memory cells 106, 108, and 110 is provided its write enable signal via a local write line 112, 114, 116 associated with that specific subset. That is, the memory cells of the first subset of memory cells 106 receive their write enable signal from the first local write line 112, the memory cells of the second subset of memory cells 108 receive their write enable signal from the second local write line 114, and the memory cells of the Nth subset of memory cells 110 receive their write enable signal from the Nth local write line 116. In this configuration, data can be written to individual subsets (i.e., fewer than all of the subsets) of memory cells that make up the data word (e.g., data could be written to only the second subset of memory cells 108, data could simultaneously be written to the first 106 and Nth 110 subsets of memory cells).

Control of the local write lines 112, 114, 116, and corresponding writing of data to the subsets of memory cells 106, 108, 110, is provided by a plurality of sets of selection logic 118, 120, 122. In the embodiment of FIG. 1, each set of selection logic 118, 120, 122 circuits receives signals from a global write word line 124 and an individual selection signal 126, 128, 130. The global write word line 124 provides a signal that data is to be written (e.g., to some or all subsets of memory cells 106, 108, 110). The individual selection signals 126, 128, 130 provide an indication of to which subsets of memory cells 106, 108, 110 data is to be written. For example, when the global write word line 124 is active and the first selection signal 126 is active, the first selection logic 118 determines that the first subset of memory cells 106 is to be written to. Accordingly, the first selection logic 118 activates the first local write line 112 that is connected to the write enable input of each of the memory cells of the first subset 106. In response to the first local write line signal 112, the memory cells of the first subset 106 store the data present at their input pin. Similarly, when the global write word line 124 is active and the Nth selection signal 130 is active, the Nth selection logic 122 determines that the Nth subset of memory cells 110 is to be written to. Accordingly, the Nth selection logic 122 activates the Nth local write line 116 that is connected to the write enable input of each of the memory cells of the Nth subset 110. In response to the Nth local write line signal 116, the memory cells of the Nth subset 110 store the data present at their input pin.

In certain embodiments, only one subset of memory cells 106, 108, 110 may be written to at a time. In such an example, the memory circuit may only include a number of write pins corresponding to the memory cells of one subset (e.g., M/N write pins). In embodiments, read operations may be similarly controlled via subset selection logic, with a corresponding limited number of read pins. In other embodiments, a single read word line signal 104 may facilitate reading of the entire data word simultaneously via M output pins.

In certain embodiments, the use of local write lines can provide a number of advantages. For example, local write lines can enable writing of less than an entire word of data at a time (e.g., byte-write enable), with the subset(s) of memory cells to be written to being selectable (e.g., via a Y-MUX operation). Data write performance may also be improved. In implementations where a write word line is connected to every memory cell of a data word, the write word line is affected by loading from each of those memory cells. That loading can adversely affect signal propagation time in communicating write enable signals (e.g., to a memory cell furthest from the origin of the write word line signal). Delayed arrival of write enable signals can hamper speed of operation as well as causing synchronization difficulties (e.g., ensuring that data to be written is present at the input pin of a memory cell during the appropriate time window when that memory cell is write enabled and performing a write operation). Local write lines are each connected to fewer memory cells, mitigating loading and write enable signal propagation issues. In some implementations, the global write line 124 is not connected to any memory cells directly (e.g., the only connection is indirectly through selection logic), such that any loading issues on the global write word line 124 are limited.

Figure 2A:
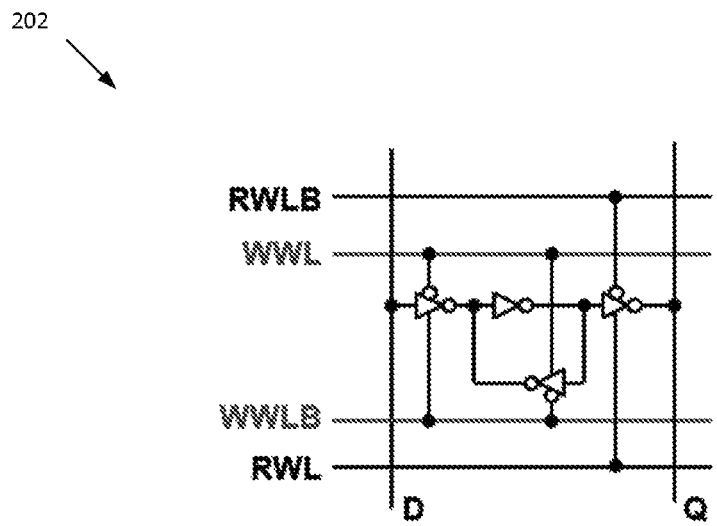
FIGS. 2A-2B are diagrams depicting a memory circuit implementing a divided word line in accordance with embodiments of the specification.
Figure 2B:
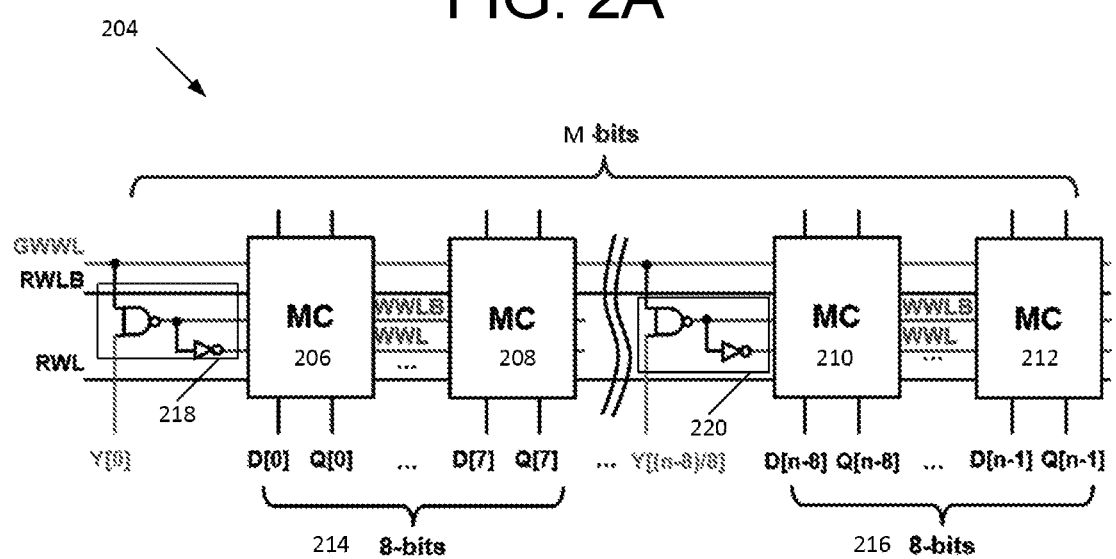

FIGS. 2A-2B are diagrams depicting a memory circuit implementing a divided word line in accordance with embodiments of the specification. FIG. 2A at 202 depicts a memory cell that is controlled by a write word line signal (WWL), a write word line bar signal (WWLB), a read word line signal (RWL) and a read word line bar signal (RWLB). When the WWL signal is active, and the WWLB signal is correspondingly inactive, writing is enabled for the memory cell such that it stores the bit value present at its D input. When the RWL signal is active, and the RWLB signal is correspondingly inactive, reading is enabled for the memory cell such that it outputs its stored bit value at its Q output.

FIG. 2B depicts a memory circuit 204 that includes a plurality of memory cells 206, 208, 210, 212 like the one depicted at 202. The plurality of memory cells 206, 208, 210, 212 correspond to one word of data. The memory cells 206, 208, 210, 212 are responsive to a read word line signal (RWL) and corresponding read word line bar signal (RWLB), each of which are provided to all of the memory cells 206, 208, 210, 212. The memory circuit 204 is divided into N subsets, each subset being associated with 8 bits of data stored in 8 memory cells. A first subset 214 includes memory cells 206, 208 (and six memory cells in between not depicted), and an Nth subset 216 includes memory cells 210, 212 (and six memory cells in between not depicted). While the example of FIGS. 2A-2B is provided in the context of a specific memory cell structure 202 and memory circuit structure 204, the disclosure contemplates numerous other configurations for implementing the systems and methods described herein.

Each subset includes selection logic. In the example of FIG. 2B, the first subset 214 is associated with first selection logic 218, and the Nth subset 216 is associated with second selection logic 220. Each set of selection logic receives a global write word line (GWWL) that indicates that a write operation is to occur, and a selection signal (one of Y[0] to Y[N-1]) associated with that subset of memory cells. That is, the first selection logic 218 receives the GWWL signal and Y[0] associated with the first subset of memory cells 214, and the Nth selection logic 220 receives the GWWL signal and Y[N-1] associated with the Nth subset of memory cells 216. (The GWWL line may be directly connected to the memory cells 206, 208, 210, 212 in some embodiments, but GWWL is not directly connected to those memory cells in other embodiments.)

Selection logic 218, 220 may be implemented in a variety of ways. In the example of FIG. 2, a local write line signal (WWL) that acts as a write enable signal for memory cells of a selected subset of memory cells is generated as the output of a NAND gate that receives the GWWL signal and a corresponding selection signal (one of Y[0] to Y[N-1]) followed by an inverter. The local write line bar signal (WWLB) is tapped from the output of the NAND gate prior to the inverter. With reference to the first subset of memory cells 214, when GWWL and Y[0] are high, indicating that data is to be written to the first subset of memory cells 214, the output of the NAND gate provided to the WWLB inputs of the memory cells of the first subset 214 is low, and the output of the inverter provided to the WWL inputs (write enable) of the memory cells of the first subset 214 is high, enabling a write operation for the memory cells (e.g., 206, 208) of the first subset. When either of GWWL or Y[0] is low, the output of the NAND gate is high and the output of the inverter is low in the first selection logic, inhibiting any write operation at the first subset. The Nth selection logic 220 operates similarly on the GWWL signal and Y[N-1]. Thus, via control of the GWWL signal and the selection signals Y[0]-Y[N-1], one or more of the subsets of memory cells can be selectively written to.

Figure 3:
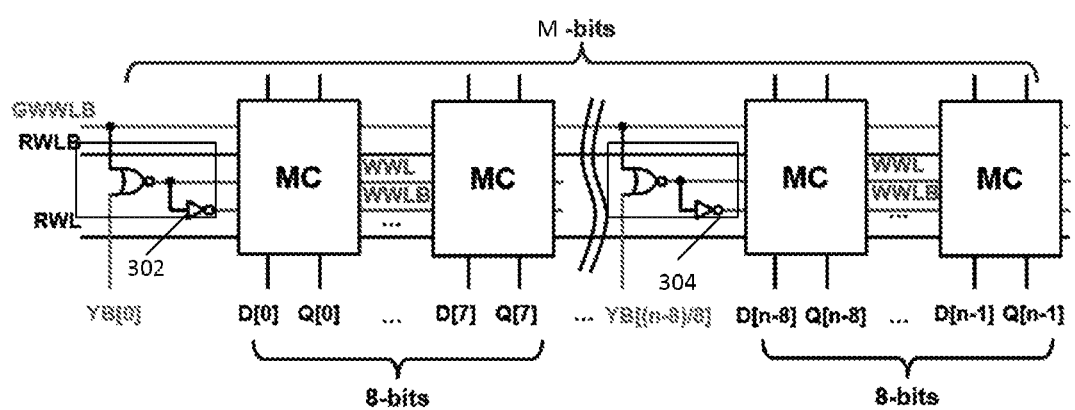
FIG. 3 is a diagram depicting a memory circuit implementing a divided word line using NOR-based selection logic in accordance with embodiments of the specification.

As noted above, the selection logic for providing signals to WWL and WWLB can be implemented in various ways. FIG. 3 is a diagram depicting a memory circuit implementing a divided word line using NOR-based selection logic in accordance with embodiments of the specification. The memory cells of FIG. 3 operate similarly in embodiments to those depicted in FIG. 2. The selection logic 302, 304 of FIG. 3 receives a global write word line bar (GWWLB) signal, which is low when a write operation is to occur, and a corresponding selection bar signal (one of YB[0] to YB[N-1]). The local write line signal (WWL) that acts as a write enable signal for memory cells of a selected subset of memory cells is generated as the output of a NOR gate that receives the GWWLB signal and a corresponding selection bar signal. That signal will be high, enabling a write operation, when GWWLB is low and the selection signal bar is low. When either of the GWWLB and YB signals are high, WWL will be low inhibiting a write operation. The corresponding WWLB signal is generated using an inverter tapped to the output of the NOR gate.

Figure 4A:
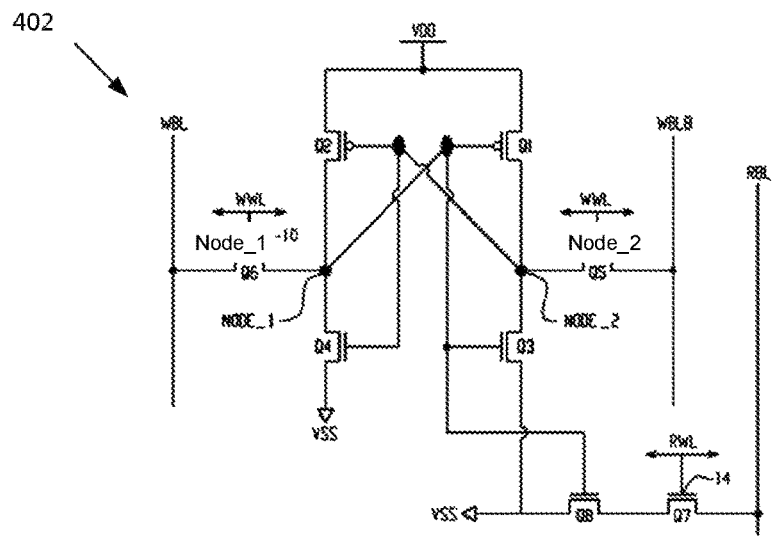
FIGS. 4A-4B are diagrams depicting a memory circuit with divided write word lines operating on a two port, eight transistor (2P8T) memory in accordance with embodiments.
Figure 4B:
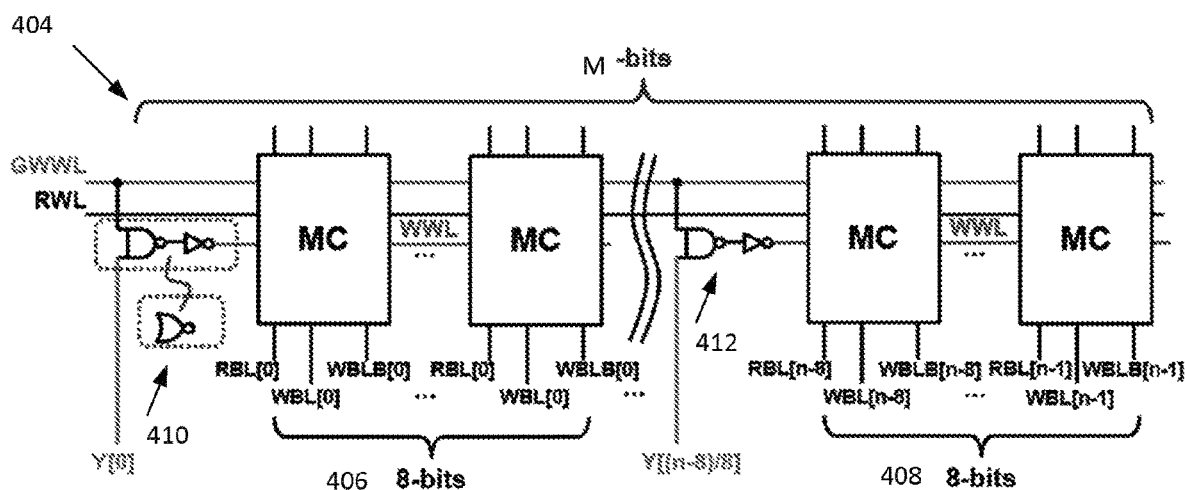

Divided write word lines can be used to provide partial word write operations on a wide variety of memory types. For example, FIGS. 4A-4B are diagrams depicting a memory circuit with divided write word lines operating on a two port, eight transistor (2P8T) memory in accordance with embodiments. A 2P8T memory cell 402 includes write-port pull-up transistors Q1 and Q2, write-port pull-down transistors Q3 and Q4, and write-port pass-gate transistors Q5 and Q6. The drains of pull-up transistor Q2 and pull-down transistor Q4 are interconnected, and the drains of pull-up transistor Q1 and pull-down transistor Q3 are interconnected. Transistors Q1, Q2, Q3, and Q4 are cross-coupled to form a data latch. Storage node Node_1 of the data latch is coupled to write bit line WBL through write-port pass-gate transistor Q6, while storage node Node_2 is coupled to write bit line WBLB through write-port pass-gate transistor Q5. Storage nodes Node_1 and Node_2 are complementary nodes that are often at opposite logic levels (logic high or logic low). Gates 10 and 12 of write-port pass-gate transistors Q6 and Q5, respectively, are connected to write word line WWL. The memory cell 402 is coupled between operation voltages VDD and VSS (e.g., ground voltage level).

Transistors Q1, Q2, Q3, Q4, Q5, and Q6 form the write-ports of the memory cell 402, with transistors Q6, Q2, and Q4 forming a first half write-port, and transistors Q5, Q1, and Q3 forming a second half write-port. The write-ports are used for writing data into the memory cell 402. The reading of the data stored in the memory cell 402 is performed through read-port pull-down transistor Q8 and read-port pass-gate transistor Q7. Gate 14 of read-port pass-gate transistor Q7 is connected to read word line RWL, which is electrically and physically separated from write word line WWL. When write operations are performed, read-port pass-gate transistor Q7 is turned off, and write-port pass-gate transistors Q5 and Q6 are turned on. The data are thus written into the memory cell 402 through write bit lines WBL and WBLB. Conversely, when read operations are performed, write-port pass-gate transistors Q5 and Q6 are turned off, and read-port pass-gate transistor Q7 is turned on. The data are thus read into read bit line RBL.

A memory circuit for controlling a plurality of memory cells implemented as a two port, eight transistor (2P8T) cells is illustrated at 404. The M-bit-wide word is divided into multiple subsets of memory cells 406, 408. A local write line (WWL) for each subset is controlled via respective selection logic 410, 412 (e.g., a NAND gate followed by an inverter, a NOR gate). Other selection logic (e.g., a single AND gate) could be implemented to achieve a similar result. Each set of selection logic 410, 412 associated with a local write line/memory cell subset receives a global write word line signal indicating that a write operation is to occur and a selection signal associated with that memory cell subset. With reference to the first subset 406, when the first selection logic receives an active GWWL signal and a high selection signal Y[0] indicating that the first subset of memory cells 406 is selected, the NAND gate output is low, providing a high WWL signal post-inverter. That high WWL signal for the first subset 406 enables the 2P8T memory cells of the first subset for writing. While the example of FIGS. 4A-4B is provided in the context of a specific memory cell structure 204 and memory circuit structure 404, the disclosure contemplates numerous other configurations for implementing the systems and methods described herein.

Figure 5A:
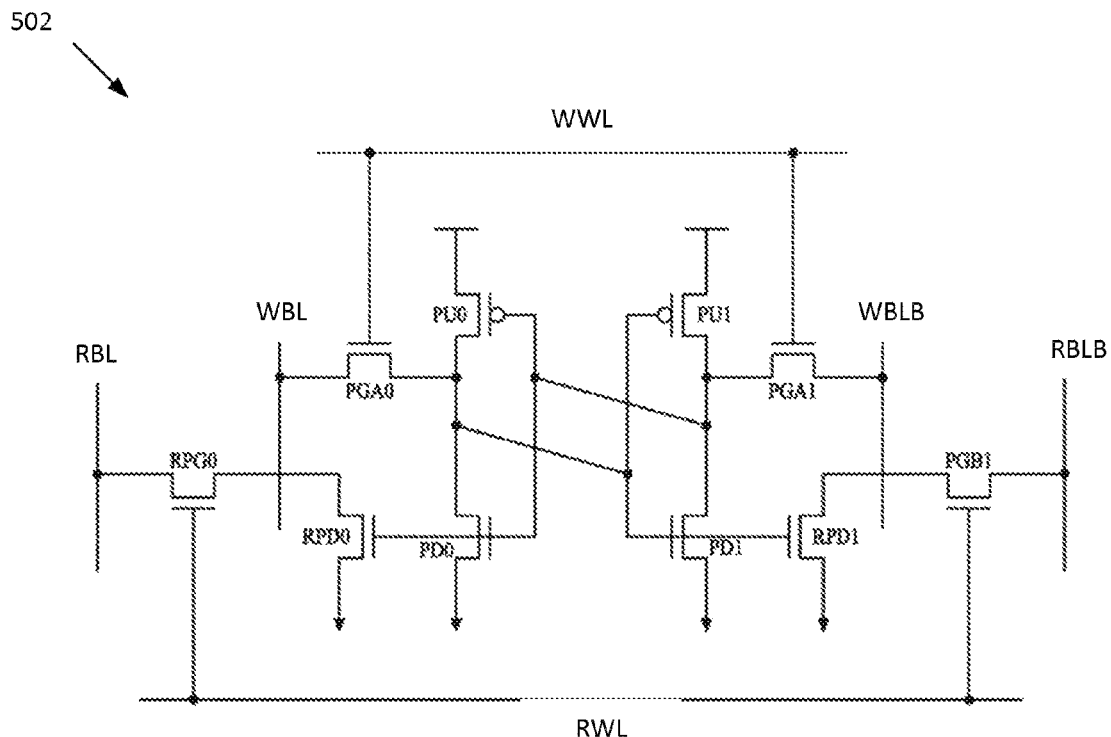
FIGS. 5A-5B depict a memory circuit having a plurality of local write lines operating with two port, ten transistor (2P10T) memory cells in accordance with embodiments.
Figure 5B:
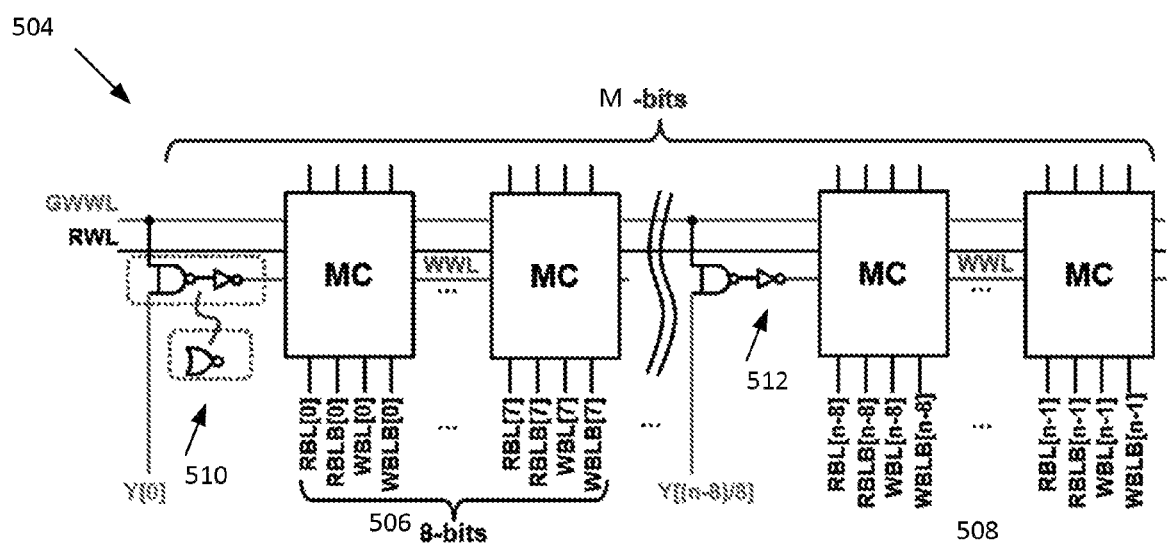

FIGS. 5A-5B depict a memory circuit having a plurality of local write lines operating with two port, ten transistor (2P10T) memory cells in accordance with embodiments. A 2P10T memory cell 502 comprises ten transistors RPG0, PGA0, RPD0, PU0, PD0, PU1, PD1, PGA1, RPG1, PPD1. The transistors RPG0, PGA0, RPD0, PD0, PD1, PGA1, RPG1, and PPD1 are N-type field-effect transistor, and the transistors PU0 and PU1 are P-type field-effect transistor. The 2P10T memory cell has four pass-gate transistors PGA0, PGB0, PGA1, PGB1 and four pull-down transistors RPD0, PD0, RPD1, PD1, where transistors RPD0 and RPD1 are mirror transistors of the transistors PD0 and PD1 respectively.

A memory circuit for controlling a plurality of memory cells implemented as 2P10T cells is illustrated at 504. The M-bit-wide word is divided into multiple subsets of memory cells 506, 508. A local write line (WWL) for each subset is controlled via respective selection logic 510, 512 (e.g., a NAND gate followed by an inverter, a NOR gate). Each set of selection logic 510, 512 associated with a local write line/memory cell subset receives a global write word line signal indicating that a write operation is to occur and a selection signal associated with that memory cell subset. With reference to the first subset 506, when the first selection logic receives an active GWWL signal and a high selection signal Y[0] indicating that the first subset of memory cells 506 is selected, the NAND gate output is low, providing a high WWL signal post-inverter. That high WWL signal for the first subset 506 enables the 2P10T memory cells of the first subset for writing. While the example of FIGS. 5A-5B is provided in the context of a specific memory cell structure 502 and memory circuit structure 504, the disclosure contemplates numerous other configurations for implementing the systems and methods described herein.

Figure 6A:
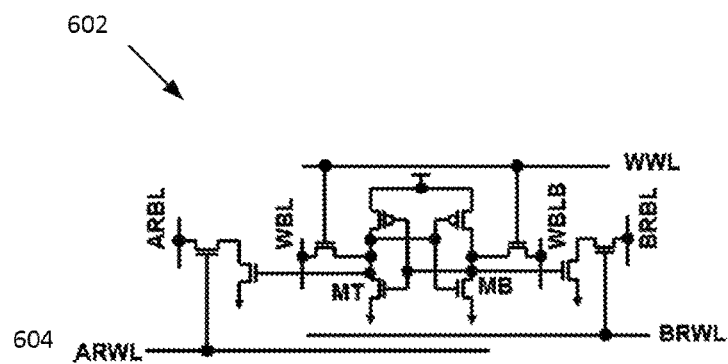
FIGS. 6A-6B depict a memory circuit having a plurality of local write lines operating with three port, ten transistor (3P10T) memory cells in accordance with embodiments.
Figure 6B:
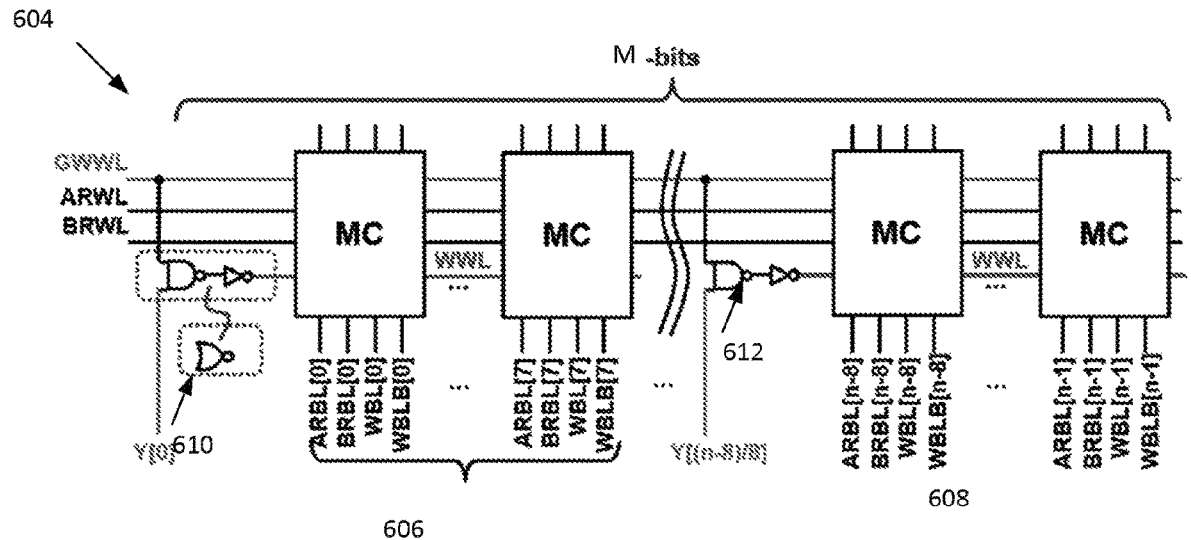

FIGS. 6A-6B depict a memory circuit having a plurality of local write lines operating with three port, ten transistors (3P10T) memory cells in accordance with embodiments. A 3P10T memory cell, depicted at 602, performs similarly to a 2P10T cell for write operations. A 3P10T memory cell can include a separate read port accessible via the A/BRWL lines, enabling support for an additional simultaneous read operation. As depicted in FIG. 6A, a gate of the pull-down transistor at the A/BRWL port is connected to the internal storage node (e.g., a pull down transistor controlled using signals on the read word line is connected to a storage node of a particular memory cell).

A memory circuit for controlling a plurality of memory cells implemented as 3P10T cells is illustrated at 604. The M-bit-wide word is divided into multiple subsets of memory cells 606, 608. A local write line (WWL) for each subset is controlled via respective selection logic 610, 612 (e.g., a NAND gate followed by an inverter, a NOR gate). Each set of selection logic 610, 612 associated with a local write line/memory cell subset receives a global write word line signal indicating that a write operation is to occur and a selection signal associated with that memory cell subset.

With reference to the first subset 606, when the first selection logic receives an active GWWL signal and a high selection signal Y[0] indicating that the first subset of memory cells 606 is selected, the NAND gate output is low, providing a high WWL signal post-inverter. That high WWL signal for the first subset 606 enables the 3P10T memory cells of the first subset for writing. While the example of FIGS. 6A-6B is provided in the context of a specific memory cell structure 602 and memory circuit structure 604, the disclosure contemplates numerous other configurations for implementing the systems and methods described herein.

Figure 7:
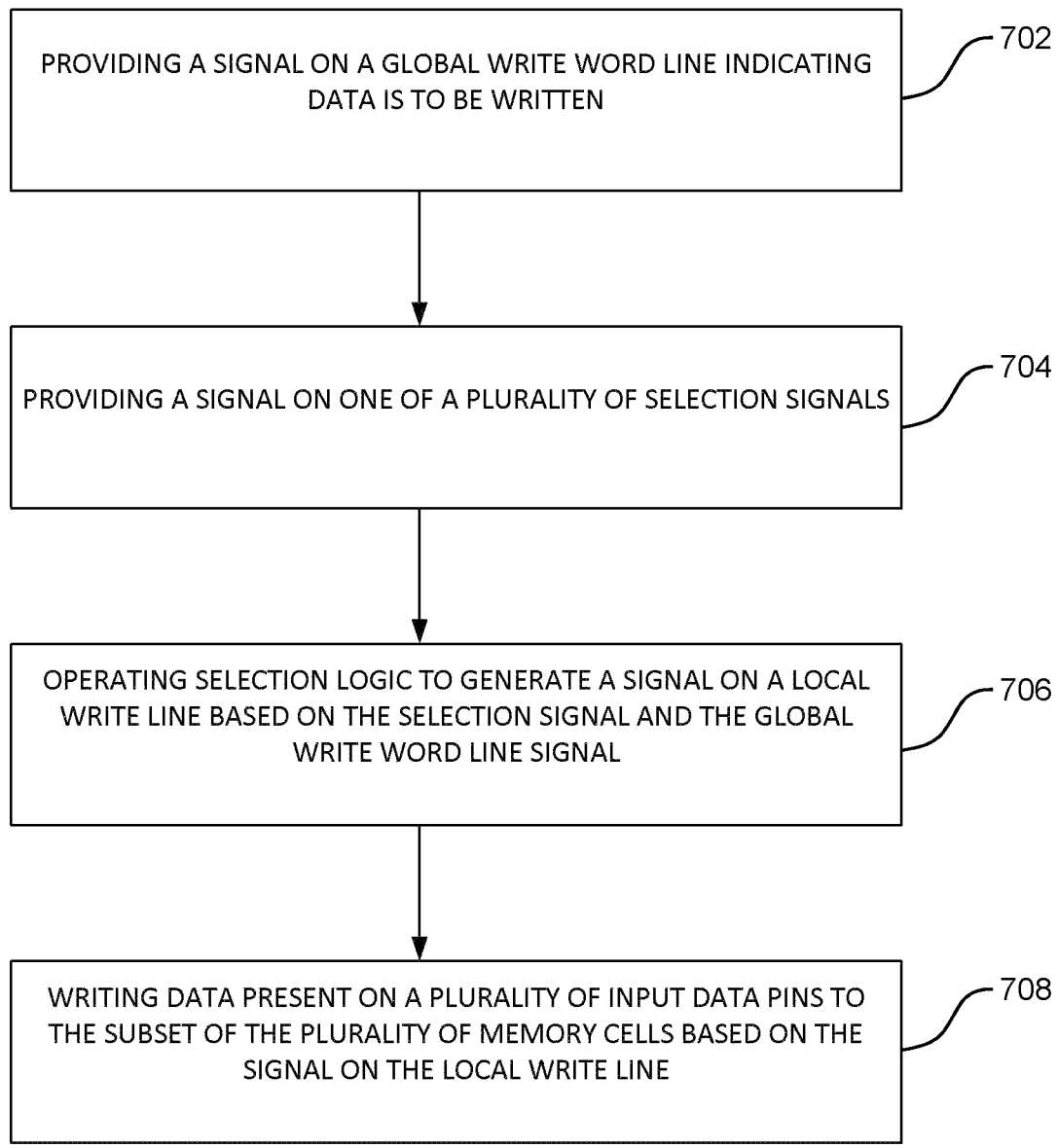
FIG. 7 is a flow diagram depicting a method of operating a memory circuit comprising a plurality of memory cells corresponding to a word of data in accordance with certain embodiments of the disclosure.

FIG. 7 is a flow diagram depicting a method of operating a memory circuit comprising a plurality of memory cells corresponding to a word of data in accordance with certain embodiments of the disclosure. While the example of FIG. 7 is described with reference to structures of previous embodiments for ease in understanding, the method is applicable to other structures as well. At 702, a signal is on a global write word line (GWWL) indicating data is to be written. At 704, a selection signal is provided on one of a plurality of selection lines Y[x], each selection line being associated with a subset of the plurality of memory cells. Selection logic (410, 412) is operated at 706 to generate a signal on a local write line (WWL) connected to the subset of the plurality of memory cells associated with the selection signal and, at 708, data present on a plurality of input data pins (WBL[ ]) is written to the subset of the plurality of the plurality of memory cells based on the signal on the local write line (WWL).

According to some embodiments, a memory circuit includes a plurality of memory cells corresponding to a word of data and a global write word line. A plurality of local write lines are connected to a subset of the plurality of memory cells of the word of data. Selection logic is configured to activate a particular subset of memory cells for writing via a particular local write line based on a signal on the global write line and a selection signal associated with the particular subset of memory cells.

In embodiments, a memory circuit comprising a plurality of memory cells corresponding to a word of data is operated by providing a signal on a global write word line indicating data is to be written. A signal is provided on one of a plurality of selection signals, each selection signal being associated with a subset of the plurality of memory cells. Selection logic is operated to generate a signal on a local write line connected to the subset of the plurality of memory cells associated with the selection signal and data present on a plurality of input data pins is written to the subset of the plurality of the plurality of memory cells based on the signal on the local write line.

In certain embodiments, a metal routing network for operating a memory circuit having a plurality of memory cells corresponding to a word of data includes a global write word line and a read word line configured for connection to each of the plurality of memory cells. A plurality of selection signal lines are included, each selection signal line being associated with a subset of the plurality of memory cells. A local write line is configured for connection to a subset of the plurality of memory cells, where the local write line is configured for connection to selection logic that receives a signal from the global write word line and the selection signal line associated with the subset of the plurality of memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
    a plurality of memory cells corresponding to a word of data;
    a global write word line;
    a plurality of local write lines, each local write line connected to a subset of the plurality of memory cells of the word of data; and
    selection logic configured to activate a particular subset of memory cells for writing via a particular local write line based on a signal on the global write line and a selection signal associated with the particular subset of memory cells.

2. The memory circuit of claim 1, further comprising:
    a read word line connected to all of the memory cells of the word of data.

3. The memory circuit of claim 2, wherein a gate of a pull down transistor controlled using signals on the read word line is connected to a storage node of a particular memory cell.

4. The memory circuit of claim 1, wherein the global write word line is not directly connected to any of the memory cells.

5. The memory circuit of claim 1, wherein a particular memory cell is responsive to a write input and a write bar input, wherein the selection logic is configured to generate signals to the write input and the write bar input.

6. The memory circuit of claim 1, wherein a particular memory cell is configured to store data from a data input of the particular memory cell when the particular memory cell is a member of the particular subset of memory cells activated by the selection logic.

7. The memory circuit of claim 1, wherein a particular memory cell is responsive to a read input, a write input, a write bar input.

8. The memory circuit of claim 7, wherein the selection logic is configured to generate signals for the write input and the write bar input using one NAND gate and one inverter.

9. The memory circuit of claim 7, wherein the selection logic is configured to generate signals for the write input and the write bar input using one NOR gate and one inverter.

10. The memory circuit of claim 1, wherein the word of data corresponds to M bits and wherein each local write line controls M/N bits.

11. The memory circuit of claim 10, wherein M=64; N=8; and M/N=8.

12. The memory circuit of claim 10, wherein the memory circuit includes M/N pins for inputting data to write.

13. The memory circuit of claim 12, wherein the memory circuit includes M or M/N pins for outputting read data.

14. The memory circuit of claim 10, wherein the memory circuit is configured for simultaneous writing of x*M/N bits at a time, where x is an integer between 1 and N.

15. The memory circuit of claim 1, wherein the memory cells are 2P8T, 2P10T, or 3P10T memory cells.

16. A method of operating a memory circuit comprising a plurality of memory cells corresponding to a word of data, comprising:

providing a signal on a global write word line indicating data is to be written;

providing a selection signal on one of a plurality of selection lines, each selection line being associated with a subset of the plurality of memory cells; and activating a particular subset of memory cells for writing via a particular local write line based on a signal on the global write line and a selection signal associated with the particular subset of memory cells.

17. The method of claim 16, wherein the memory circuit further comprises:

a read word line connected to all of the memory cells of the word of data.

18. The method of claim 17, wherein a gate of a pull down transistor controlled using signals on the read word line is connected to a storage node of a particular memory cell; and wherein the global write word line is not directly connected to any of the memory cells.

19. The method of claim 16, wherein a particular memory cell is responsive to a write input and a write bar input, wherein the activating generates signals to the write input and the write bar input.

20. An apparatus comprising:

a plurality of memory cells corresponding to a word of data;

a global write word line;

a plurality of local write lines, each local write line connected to a subset of the plurality of memory cells of the word of data; and means for activating a particular subset of memory cells for writing via a particular local write line based on a signal on the global write line and a selection signal associated with the particular subset of memory cells.

* * * * *